(12) United States Patent
Kawachi et al.

(10) Patent No.: US 6,617,080 B1
(45) Date of Patent: Sep. 9, 2003

(54) PHOTOMASK, SEMICONDUCTOR DEVICE, AND METHOD FOR EXPOSING THROUGH PHOTOMASK

(75) Inventors: Toshihide Kawachi, Toyko (JP); Takuya Matsushita, Tokyo (JP); Shigenori Yamashita, Tokyo (JP); Yuki Miyamoto, Tokyo (JP); Atsushi Ueno, Tokyo (JP); Shinroku Maejima, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/563,953

(22) Filed: May 2, 2000

(30) Foreign Application Priority Data

Sep. 24, 1999 (JP) ............................. 11-270178

(51) Int. Cl.$^7$ ................................. G03F 9/00
(52) U.S. Cl. ............................. 430/5; 430/22
(58) Field of Search .................... 430/5, 22, 311; 356/401, 399; 250/491.1

(56) References Cited

U.S. PATENT DOCUMENTS 5,962,173 A * 10/1999 Leroux et al. ................. 430/5
6,093,511 A * 7/2000 Tanaka et al. ................. 430/30

FOREIGN PATENT DOCUMENTS

| JP | 9-74063 | 3/1997 |
| JP | 9-244222 | 9/1997 |

* cited by examiner

Primary Examiner—S. Rosasco
(74) Attorney, Agent, or Firm—McDermott, Will & Emery

(57) ABSTRACT

The present invention provides a photomask, a semiconductor device, and a method for exposing through the photomask. The photomask comprises a photomask substrate, and an on-mask circuit area including an on-mask circuit pattern and an on-mask test mark area including an on-mask test pattern, both formed on the surface of the substrate, wherein the photomask substrate further includes an on-mask photolithography screening mark area including an on-mask comparison pattern and an on-mask screening pattern, the on-mask comparison pattern has substantially the same configuration as at least a part of the on-mask circuit pattern, and the on-mask screening pattern has substantially the same configuration as at least a part of the on-mask test pattern. The present invention allows it to measure the actual displacement generated from an overlaying (i.e. alignment) process for the purpose of eliminating of an the overlay displacement which can take place in a photolithography process.

13 Claims, 9 Drawing Sheets

PHOTOMASK, SEMICONDUCTOR DEVICE, AND METHOD FOR EXPOSING THROUGH PHOTOMASK

BACKGROUND OF THE INVENTION

1. Field of the Invention

The present invention relates to a mask pattern formed on a photomask, a pattern formed on a semiconductor device, and a method for exposing through the photomask to form a resist pattern of which a position is employed to correct an exposure condition.

In the present specification, an overlay error measuring mark formed on the photomask will specifically be referred to as an on-mask photolithography screening mark and the mark transferred onto or formed on a resist layer or a semiconductor substrate in order to determine the amount of pattern displacement will be referred to as a photolithography screening mark.

2. Description of the Related Art

Size reduction of a semiconductor device has been achieved by reducing the size of each component. In addition to this, since the semiconductor device is composed of a plurality of circuit layers, contact holes and the other elements, it is also an important technique in view of size reduction to improve the overlay accuracy for various elements.

A series of processes such as layer formation, photolithography operation and etching to form the elements in the manufacture of the semiconductor device will hereafter collectively be referred to as a "manufacturing process". A semiconductor device is typically manufactured by a plurality of manufacturing processes. When a patterned first circuit layer is formed on a semiconductor substrate and then a second patterned circuit layer is to be formed on the first circuit layer, the second circuit layer is blanket deposited on the first circuit layer, and then a resist layer is formed on the second circuit layer. The resist layer is then exposed to light through a photomask that includes a pattern corresponding to a pattern of the second circuit layer to form a resist pattern.

The photomask has various patterns formed thereon in correspondence to the circuit and other patterns formed on the semiconductor substrate. By exposing the resist layer to light through the pattern formed on the photomask (namely exposure), a pattern that is ideally a similar figure to the photomask pattern is formed on the resist layer. Actually, however, a displacement between a designed pattern of the second circuit layer corresponding to the pattern of the first circuit layer and the resulting resist pattern may occur due to optical conditions such as optical aberration through an optical system in the exposure apparatus. When the pattern of the second circuit layer is etched by using a resist pattern that has a displacement, the resulting pattern of the second circuit layer also includes a displacement from a designed position. The displacement of the resist pattern is usually called the overlay displacement.

There have been various marks used in the photolithography processes to measure various data related to the photolithography. In this specification, these marks will all be called the measurement mark.

In order to measure the amount of the overlay displacement, for example, a mark called an alignment mark is formed on the photomask or transferred with the photomask on the semiconductor substrate. This is also a kind of the measurement mark described above.

Among the overlay displacements, one which is determined using the alignment mark formed on the photomask and the alignment mark actually formed in the resist pattern is called a position error. Moreover, when a pattern (such as a line in a circuit and a contact hole) is formed on the semiconductor substrate using a resist pattern that includes the position error, a deviation in the dimension or the shape from the ideal pattern of similar shape is produced. This is called a patterning error.

The smaller the element dimensions the smaller the tolerance for overlay displacement caused by the effect of optical aberration on the optical system in the exposure apparatus.

Specifically, the position error due to frame aberration as a type of optical aberration is described for example in Japanese Kokai Patent Publication No. Hei 9 (1997)-74063, especially in the description referring to FIGS. 59 to 61.

As a technique for reducing the position error, Japanese Kokai Patent Publication Nos. Hei 9 (1997)-74063 and Hei 9 (1997)-244222 propose technologies for improving the measurement mark used to relatively determine the position error such as the alignment mark.

However, even when the measurement mark is improved according to the description in the publications mentioned hereinbefore, the following problems are expected to occur when the element sizes are further reduced.

The first problem is that since the value of overlay displacement determined by using the conventional measurement mark is a relative position error of the pattern formed in the subsequent manufacturing process to the pattern formed in the previous manufacturing process, it is not possible to determine merely the actual position error of the pattern obtained in the subsequent manufacturing process.

Particularly, since the position error may block further reduction of element sizes, it is required to accurately determine the amount of the position error.

The second problem refers to the difficulty of analyzing the overlay displacement.

In the prior art, for example, when a relative position error is larger than a limit value after completing a plurality of manufacturing processes, a main cause of the error has been attributed to a downstream manufacturing process because the value of position error generated in the downstream manufacturing process is normally larger than one generated in an upstream manufacturing process. In the prior art, however, it has been difficult to determine which of a upstream or a downstream manufacturing process has greater contribution to the final position error in actuality.

SUMMARY OF THE INVENTION

The present invention has been made to solve the problems described above, and a first object thereof is to provide a photomask and a semiconductor device that allow it to accurately determine the actual position error and the patterning error separately for each manufacturing process.

Second object of the present invention is to provide a semiconductor device having higher precision and a less patterning error.

Third object of the present invention is to provide an exposure method comprising the correction of exposure conditions based on the resulting position error data.

The photomask according to the first aspect of the present invention comprises a photomask substrate, and an on-mask circuit area including an on-mask circuit pattern and an on-mask test mark area including an on-mask test pattern, both formed on the surface of the substrate, wherein the photomask substrate further includes an on-mask photolithography screening mark area including an on-mask comparison pattern and an on-mask screening pattern, the on-mask comparison pattern has substantially the same configuration as at least a part of the on-mask circuit pattern, and the on-mask screening pattern has substantially the same configuration as at least a part of the on-mask test pattern.

According to the present invention, the photomask has the on-mask comparison pattern and the on-mask screening pattern disposed close to each other.

According to the present invention, either one of the on-mask comparison pattern or the on-mask screening pattern is disposed at both ends of the other.

According to the present invention, either one of the on-mask comparison pattern or the on-mask screening pattern is disposed to surround the other.

According to the present invention, the on-mask comparison pattern and the on-mask screening pattern combine to form a cross-shaped mark on the photomask.

According to the present invention, either one of the on-mask photolithography screening mark area or the on-mask test mark area is included in the other, and the on-mask test pattern further serves as the on-mask screening pattern.

According to the present invention, the photomask may have a plurality of the on-mask photolithography screening mark areas and arrangement thereof may be at any position.

Second aspect of the present invention is a semiconductor device comprising a semiconductor substrate having a circuit area including circuit patterns and a measurement mark area including measurement patterns formed on the surface of the semiconductor substrate in the same manufacturing process as the circuit pattern, wherein the semiconductor substrate further includes a photolithography screening mark area including a screening pattern.and a comparison pattern, the comparison pattern has substantially the same configuration as at least a part of the circuit pattern, and the screening pattern has substantially the same configuration as at least a part of the the measurement pattern.

In the semiconductor device according to the present invention, the screening pattern and the comparison pattern are disposed close to each other in the same manufacturing process.

According to the present invention, second model of a semiconductor device comprises a semiconductor substrate, and a plurality of photolithography screening mark areas including a screening pattern formed on the surface of the semiconductor substrate, wherein the photolithography screening mark area further includes a comparison pattern formed in the same manufacturing process as the screening pattern to be close thereto, and a dimensional difference between the screening patterns having the same configuration and the same dimensions included in different photolithography screening mark areas equals to a dimensional difference between the comparison-patterns of the same configuration and the same dimensions included in the photolithography screening mark areas. In this semiconductor device, the screening pattern and the comparison pattern are disposed close to each other.

According to the present invention, third model of a semiconductor device comprises a semiconductor substrate manufactured by employing a photolithography process using a photomask comprising a photomask substrate, and an on-mask circuit areas including on-mask circuit patterns, an on-mask test mark area including on-mask test patterns and an on-mask photolithography-screening mark area including an on-mask comparison pattern and an on-mask screening pattern, all of them formed on the surface of the substrate, wherein the on-mask comparison pattern has substantially the same configuration as at least a part of the on-mask circuit pattern, and the on-mask screening pattern has substantially the same configuration as at least a part of the on-mask test pattern, whereby a plurality of photolithography screening mark areas corresponding to the on-mask photolithography screening mark areas, including a screening pattern corresponding to the on-mask screening pattern and a comparison pattern corresponding to the on-mask comparison pattern formed on the surface of the semiconductor substrate, a dimensional difference between the screening patterns having the same configuration and the same dimensions included in different photolithography screening mark areas, respectively, equals to a dimensional difference between the comparison patterns of the same configuration and the same dimensions included in the photolithography screening mark areas.

In the present invention, the photomask comprises the on-mask screening pattern and the on-mask comparison pattern, both disposed close to each other.

According to the semiconductor device of the present invention, either one of the screening pattern or the comparison pattern is disposed at both ends of the other.

According to the semiconductor device of the present invention, either one of the screening pattern or the comparison pattern is disposed to surround the other.

According to the semiconductor device of the present invention, the screening pattern and the comparison pattern combine to form a cross-shaped mark.

In the semiconductor device according to the present invention, either one of the photolithography screening mark area and the measurement mark area may be included in the other, and the measurement pattern may have the function of the screening pattern as well.

In the semiconductor device according to the present invention, the photolithography screening mark area may be included in plurality and arrangement thereof may be at any position.

An exposure method according to another aspect of the present invention uses an exposure apparatus equipped with a photomask, comprising:

(i) a step of exposing a resist layer formed on a surface of a semiconductor substrate to light on the exposure apparatus equipped with the photomask comprising a photomask substrate, and an on-mask circuit area including on-mask circuit patterns, an on-mask test mark area including on-mask test patterns and an on-mask photolithography screening mark area including an on-mask comparison pattern and an on-mask screening pattern, all of them formed on the surface of the substrate, wherein the on-mask comparison pattern has substantially the same configuration as at least a part of the on-mask circuit pattern, and the on-mask screening pattern has substantially the same configuration as at least a part of the on-mask test pattern, thereby to form an on-resist circuit area that correspond to the on-mask circuit area, on-resist circuit patterns that correspond to the on-mask circuit patterns, an on-resist test-mark area that correspond to the on-mask test mark area, on-resist test patterns that correspond to the on-mask test patterns, an on-resist photolithography screening mark area that correspond to the on-mask photolithography screening mark area, an on-resist screening pattern that correspond to the on-mask screening pattern, and an on-resist comparison pattern that correspond to the on-mask comparison pattern on the resist layer; and (ii) a step of correcting the exposure conditions based on a position error data obtained by measuring a distance between the on-resist screening pattern and the on-resist comparison pattern.

On the photomask used-in the method of the present invention, the on-mask comparison pattern and the on-mask screening pattern are disposed close to each other.

According to the exposure method of the present invention, either one of the on-mask photolithography screening mark area or the on-mask test mark area is included in the other, and the on-mask test pattern further serves as the on-mask screening pattern.

DESCRIPTION OF THE PREFERRED EMBODIMENTS

Embodiment 1 (Photomask)

Figure 1:
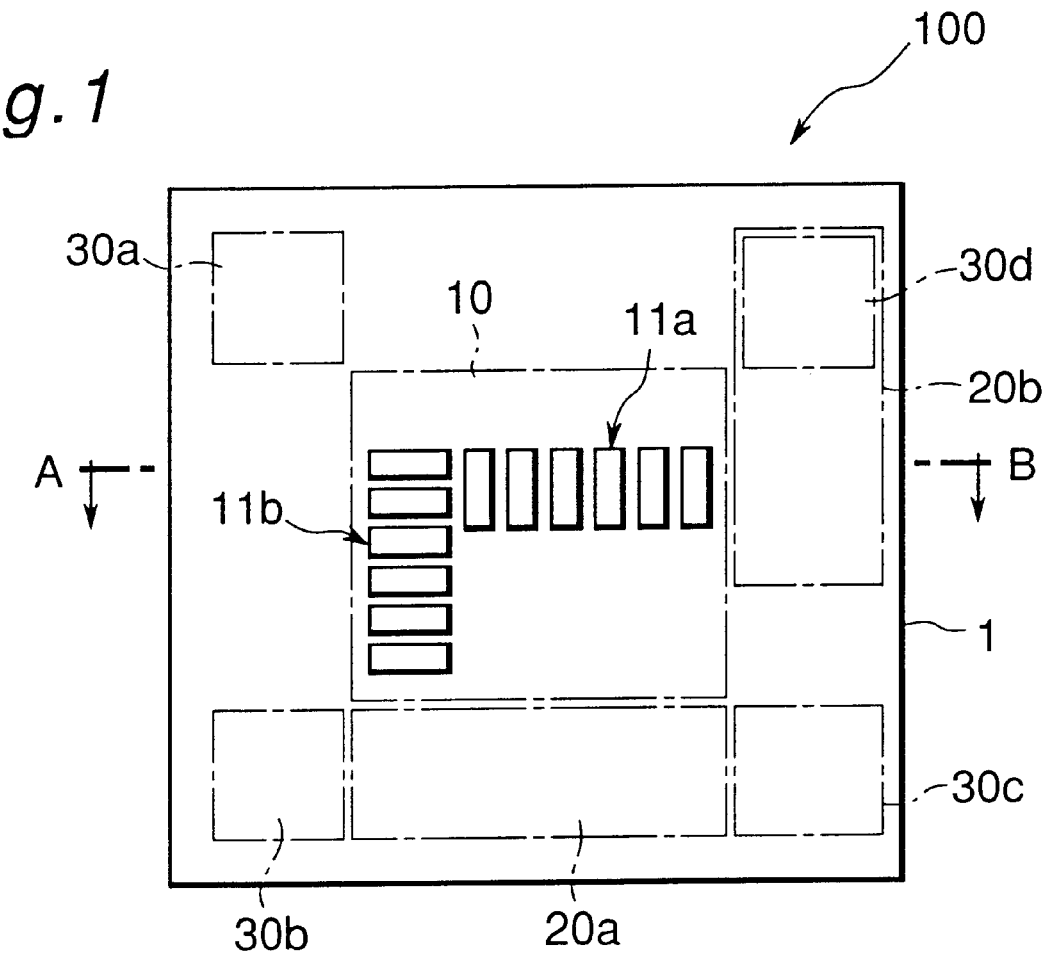
FIG. 1 is a schematic plan view showing the first embodiment of the photomask of the present invention.

Specific configuration of the photomask illustrating the first embodiment of the present invention is shown in FIGS. 1 to 3. The first embodiment concerns the manufacturing process of gate electrodes for a transistor.

FIG. 1 is a plan view of a photomask 100. The photomask 100 has an on-mask circuit area 10 formed in the center portion of a surface of a photomask substrate 1, and on-mask test mark areas 20a, 20b and the on-mask photolithography screening mark areas 30a to 30d formed in the peripheral region thereof.

On-mask Circuit Area:

Included in the on-mask circuit area (also called the chip area) 10 are an on-mask circuit pattern 11a and an on-mask circuit pattern 11b that has the same configuration and dimensions as the on-mask circuit pattern 11a but is a 90-degree rotation thereof (FIG. 1). The on-mask circuit patterns 11a, 11b correspond to patterns that constitute the actual device and are therefore the most important patterns in the photolithography operations.

FIGS. 1 to 3 all show a case where both the on-mask circuit patterns 11a and 11b correspond to a gate electrode pattern for a transistor in a circuit area formed on a semiconductor substrate.

Figure 3A:
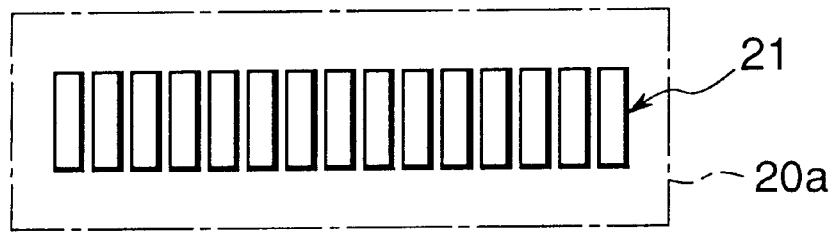
FIG. 3 is a plan view showing the on-mask test mark area that includes the on-mask photolithography screening mark area in FIG. 1.
Figure 3B:
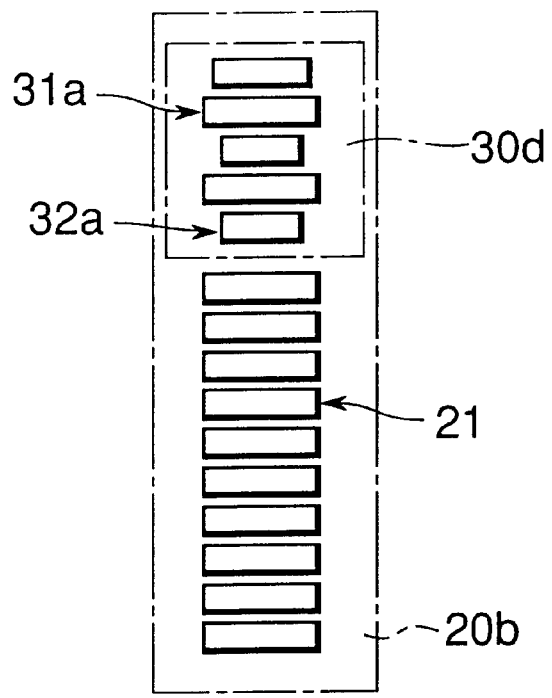

On-mask Photolithography Screening Mark Area:

The on-mask photolithography screening mark areas 30a to 30d (FIG. 1) that characterize the photomask according to the present invention all include an on-mask screening pattern 31 a and an on-mask comparison pattern 32a, as shown in FIG. 3B (FIG. 3B shows a plane view exemplifying the on-mask photolithography screening mark area 30d).

The on-mask screening pattern is a measurement mark indispensable for making a master photomask with the high accuracy needed for a desired design rule. Hitherto, the on-mask screening pattern has been optionally disposed in the peripheral region of the circuit pattern on the photomask substrate. According to the present invention, the on-mask screening pattern 31a is used in conjunction with the on-mask comparison pattern 32a to accurately determine the position error.

On the photomask of the present invention, the on-mask comparison pattern 32a and the on-mask screening pattern 31a are preferably disposed close to each other (refer to FIG. 3B).

On-mask Test Mark Area:

The on-mask test mark areas 20a and 20b include an on-mask test pattern 21, respectively, as shown in FIGS. 3A and 3B. FIGS. 3A and 3B are enlarged views of the on-mask test mark areas 20a and 20b shown in FIG. 1. The on-mask test pattern 21 is a kind of measurement marks known in the prior art, and is generally referred to as the stepper alignment mark. This is provided for the purpose of accurately determining the position of the photomask in an overlaying (i.e. alignment) step that is indispensable in the photolithography process using a stepper type exposure apparatus.

The on-mask test pattern 21 has substantially the same configuration as the on-mask screening patterns 31a and 31b as a whole, but only a part thereof may be in substantially the same configuration as the on-mask screening pattern.

In a manufacturing process including an exposure step, in general, a pattern having the similar shape of the on-mask circuit pattern can be formed on the semiconductor substrate with substantially high accuracy by adjusting the optical conditions of the exposure apparatus according to the on-mask circuit pattern, thereby eliminating the overlay displacement of the on-mask circuit pattern. However, since other patterns, particularly the on-mask test pattern 21 have different arrangements and shapes from those of the on-mask circuit patterns 11a, 11b, the optical conditions may not necessarily be optimized. As a consequence, it has been difficult in the prior art to reduce the position error of the on-mask test pattern to near that of the on-mask circuit pattern, even when the optical conditions are regulated in accordance to the on-mask circuit pattern.

Figure 4A:
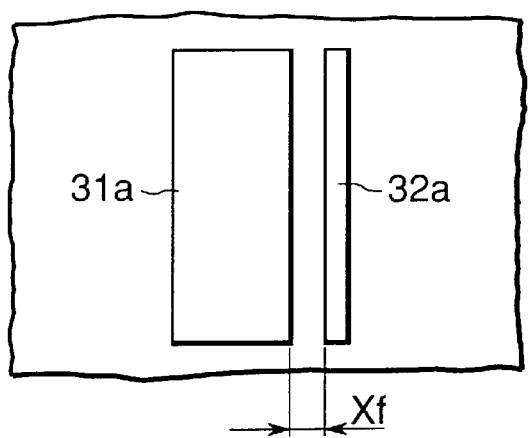
FIG. 4 shows a process flow for manufacturing the gate electrode, illustrating an exposure method of the present invention.
Figure 4B:
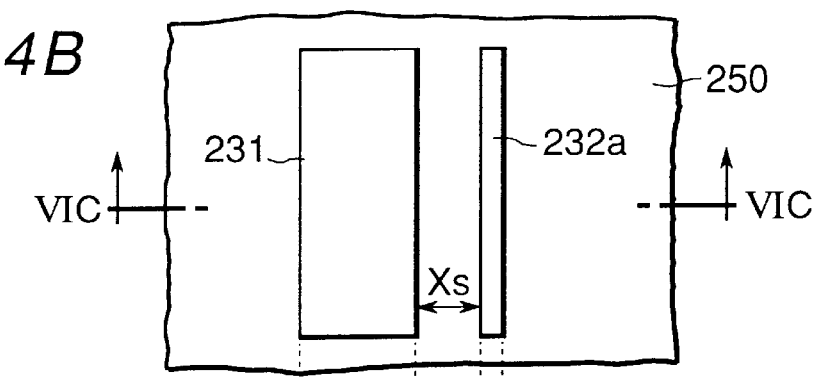
Figure 4C:
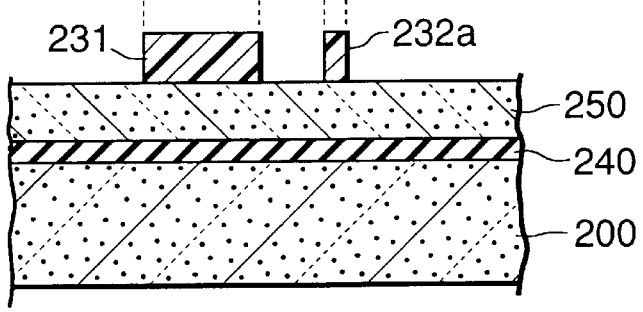
Figure 4D:
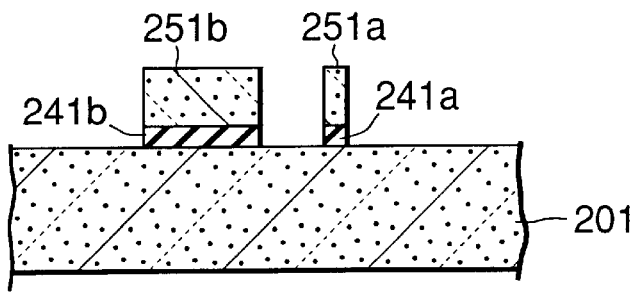

In order to overcome these problems, in the photomask of the present invention, the on-mask comparison pattern 32a having the same shape as at least a part of the on-mask circuit patterns 11a and 11b (FIG. 1) and on-mask screening pattern 31a are disposed close to each other as shown in FIG. 3B, thereby making it possible to determine an error in a position of the on-resist screening pattern based on a position of the on-resist comparison pattern on the semiconductor substrate by a projection exposure step. Specifically, as shown in FIG. 4A, the on-mask comparison pattern 32a and the on-mask screening pattern 31a are formed at a distance of Xf apart from each other on the photomask. By exposing through the photomask, resist patterns, namely an on-resist comparison pattern 232a and an on-resist screening pattern 231 are formed in a resist layer (not shown) provided on the semiconductor substrate 201 (as shown in FIGS. 4B and 4C). Assuming that the distance between the on-resist comparison pattern 232a and the on-resist screening pattern 231 thus formed is Xs, then difference between the product of Xf and a magnification of the projection, exposure system (a factor of enlargement) and the value of Xs gives the value of position error. From the value of position error, position error of the measurement pattern 21, that is actually obtained, from the designed pattern position can also be obtained.

Thus the present invention makes it possible to achieve the first object, that is to accurately determine the position error, during one manufacturing process, as well as to eliminate the problem on the complexity of analysis.

According to the first embodiment, the on-mask comparison pattern and the on-mask screening pattern formed on the photomask are disposed close to each other for improving the measuring accuracy and the like. Distance between the on-mask comparison pattern and the on-mask screening pattern depends significantly on the pattern size, measuring instrument and the like, but is typically in a range from about 0.02 micrometers to about 20 micrometers.

On the photomask of the present invention, the on-mask photolithography screening mark area 30b or 30c and the on-mask test mark area 20a may be disposed close to each other as shown in FIG. 1. In the resist pattern obtained by exposing through the photomask, the position error data obtained by the conventional method from the measurement pattern in the on-resist test mark area may be used also in the on-resist photolithography screening mark area.

Distance between the on-mask photolithography screening mark area 30b or 30c and the on-mask test mark area 20a on the photomask significantly depends on the pattern size, an instrument for measuring the position error and the like, but is preferably in a range from about 0.02 micrometers-to about 20 micrometers.

Embodiment 2 (Photomask)

A specific example of the second embodiment of the present invention is shown in FIG. 2.

While an example where the on-mask comparison pattern 32a and the on-mask screening pattern 31a are disposed close to each other is shown in the first embodiment, the second embodiment concerns an arrangement of the patterns and a combination thereof.

Figure 2A:
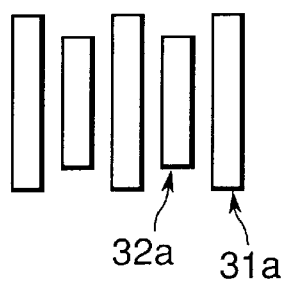
FIG. 2 is a diagram showing the combinations of the on-mask comparison pattern and the on-mask screening pattern according to the second embodiment of the photomask of the present invention.
Figure 2B:
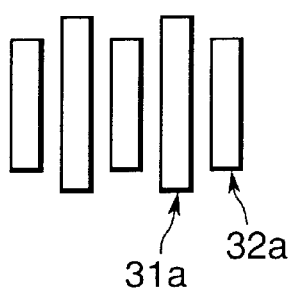

FIGS. 2A and 2B show that either one of the on-mask comparison pattern 32a or the on-mask screening pattern 31a are disposed at both ends of the other. Disposing them in the arrangement may compare the lateral displacement of the patterns each other and also improve the accuracy of the position error data.

Figure 2C:
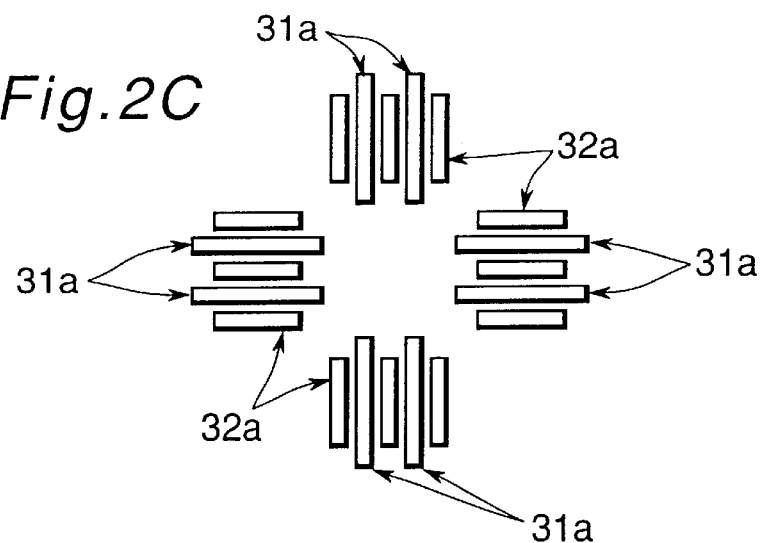

Alternatively, the on-mask comparison pattern 32a and the on-mask screening pattern 31a may also be formed by combining some arrangements shown in FIG. 2B to form a cross-shaped mark as shown in FIG. 2C. This enables it to obtain vertical displacement data as well as the lateral displacement data, and therefore position error data of even higher accuracy can be obtained. The arrangement shown in FIG. 2A can be of course used instead of that shown in FIG. 2B.

Figure 2D:
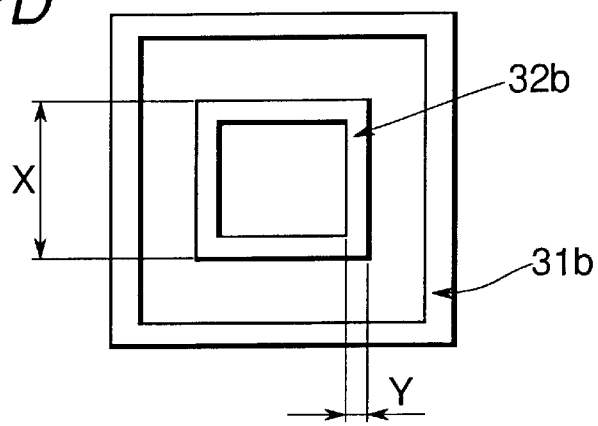

The second embodiment further includes such an arrangement which the on-mask comparison pattern 32b is surrounded by the on-mask screening pattern 31b as shown in FIG. 2D, or an arrangement reverse to the above (i.e. the on-mask comparison pattern 32b surrounds the on-mask screening pattern 31b). The on-mask comparison pattern 32b shown.in FIG. 2D is not made in the same shape as the on-mask circuit pattern 11a shown in FIG. 1 as a whole, but a portion of which data is to be obtained (especially, sides with exception of the edges in FIG. 2D) has essentially the same shape according to the present invention, as described hereinabove. Forming the patterns in the configuration and the arrangement may measure the lateral and vertical displacements of the patterns, thereby improving the accuracy of the position error data.

Squares measuring 10 micrometers to 30 micrometers in one side are currently used as the screening area on the semiconductor substrate for the alignment marks. This implies that the length X of the on-mask comparison pattern 32b shown in FIG. 2D may well be in a range from 10 micrometers to 30 micrometers. With the photomask of the present invention, however, the length X can be decreased further as the final product of the semiconductor device is made even more smaller in the future.

Width Y of the on-mask comparison pattern 32b may be in a range from about 0.155 micrometers to about 0.3 micrometers, for example, in the case of the gate electrode of a transistor, since the designed gate length of the circuit pattern is in a range from about 0.15 micrometers to about 0.3 micrometers. However, since the position error can be reduced even when the width Y of the on-mask comparison pattern 32b is twice or three times longer than the gate length, the width Y may be determined depending on the operating conditions of the exposure apparatus or other factors.

Embodiment 3 (Photomask)

The first and second embodiments as mentioned hereinbefore illustrate the case for forming the on-mask photolithography screening mark area including the on-mask comparison pattern and the on-mask screening pattern on the photomask, in which case an additional area is required on the photomask for providing the on-mask photolithography screening mark that characterizes the present invention.

For the third embodiment photomask, only the on-mask comparison pattern may be formed further in the on-mask test mark area that has been preliminarily provided on the photomask, or the on-mask photolithography screening mark area including the on-mask comparison pattern and the on-mask screening pattern is formed instead of the on-mask test mark area, and thereby making it possible to achieve the similar function to those of the first and second embodiments without needing the additional pattern area for measuring the position error. According to the third embodiment, either one of the on-mask test mark area or the on-mask photolithography screening mark area may be disposed at the ends of the other.

FIG. 3B shows a specific example of the third embodiment, indicating that the on-mask photolithography screening mark area 30d is included in the on-mask test mark area 20b. The on-mask photolithography screening mark area 30d includes the on-mask screening pattern 31a and the on-mask comparison pattern 32a, while the on-mask test mark area 20b includes the on-mask test pattern 21. The on-mask screening pattern 31a has the same shape as one of the on-mask test pattern 21. Thus, the on-mask test mark area 20b essentially consists of the on-mask test pattern 21 and the on-mask comparison pattern 32a, and therefore the on-mask test pattern 21 also serves as the on-mask screening pattern 31a.

According to the present invention, the on-mask photolithography screening mark area may include the on-mask test mark area, contrary to that shown in FIG. 3B. In this case, in the on-mask photolithography screening mark area, only the on-mask screening pattern is disposed close to the on-mask comparison pattern 32a.

Embodiment 4 (Semiconductor device)

Figure 5:
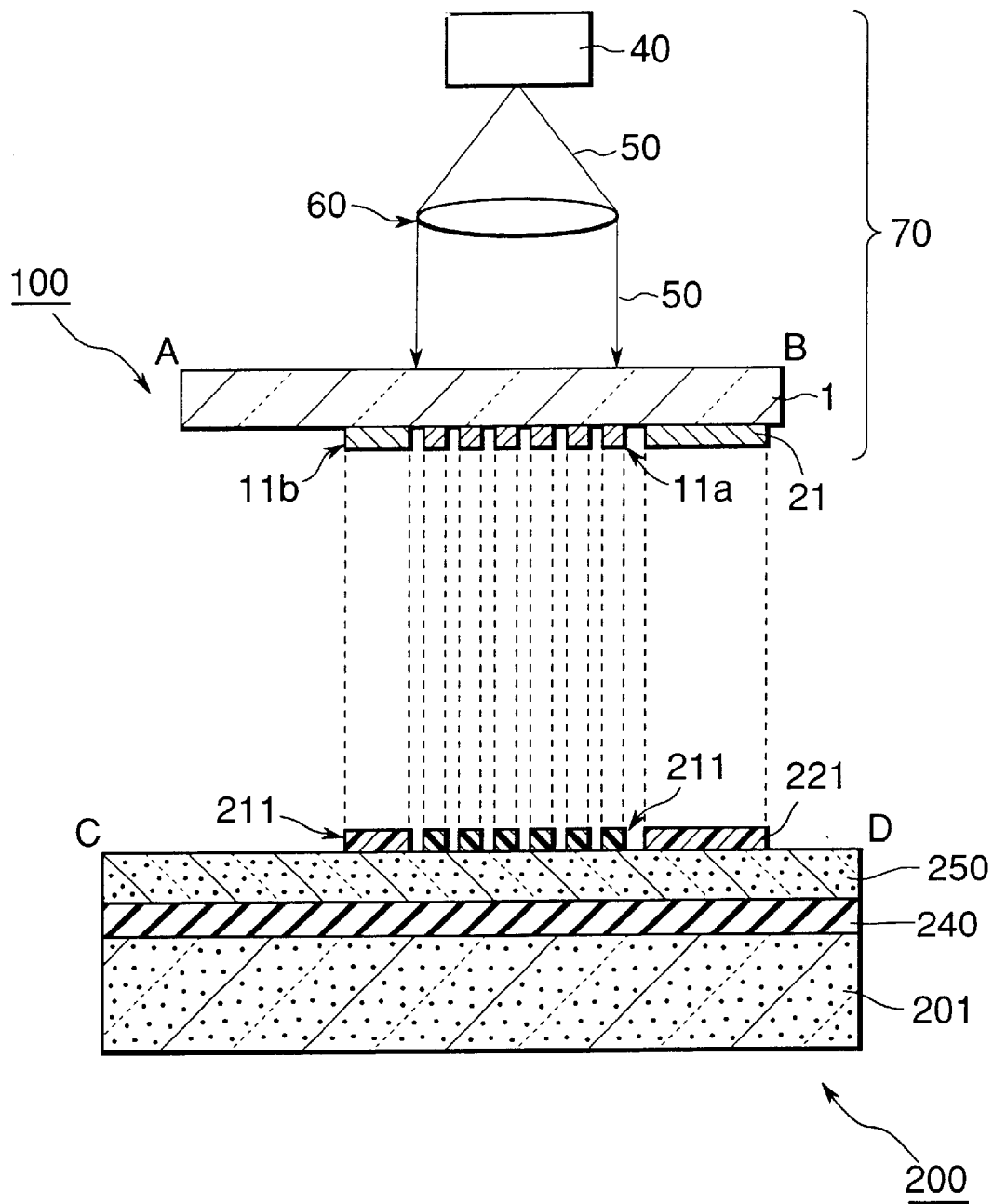
FIG. 5 is a schematic sectional view showing the exposure method of the present invention.
Figure 6:
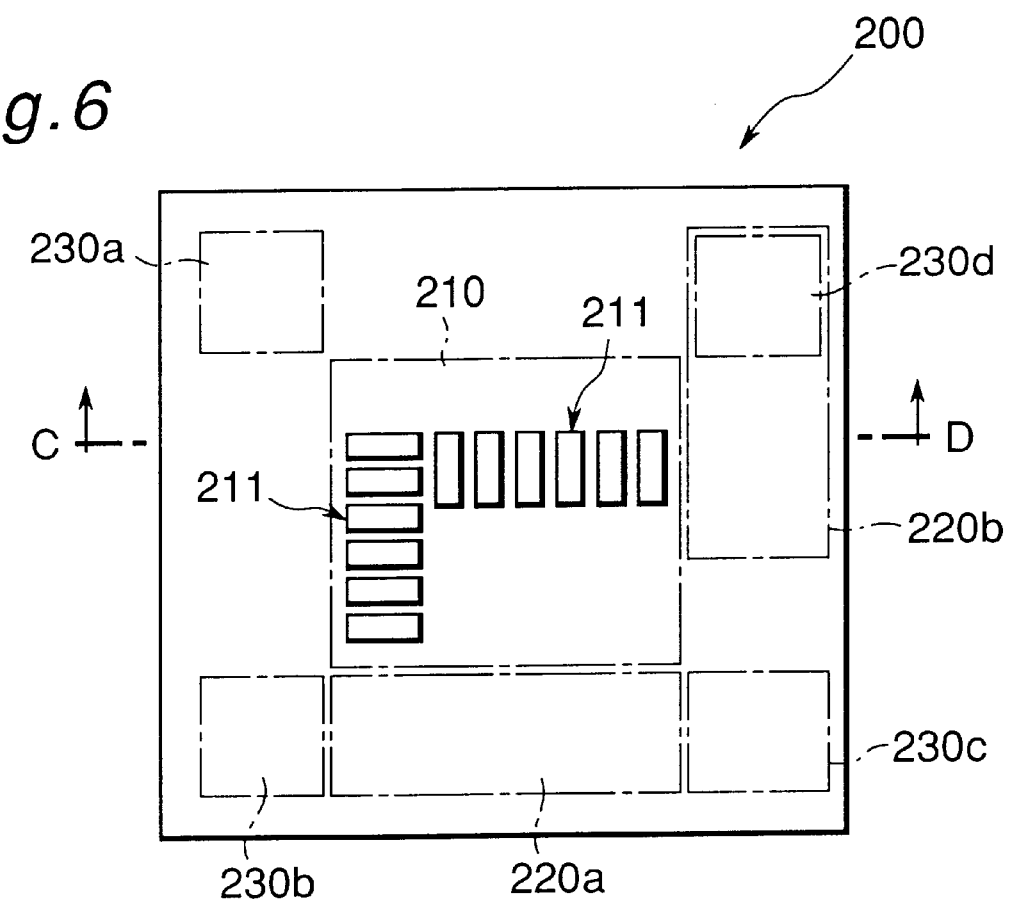
FIG. 6 is a schematic plan view showing the semiconductor device (fourth embodiment) of the present invention.

The first to third embodiments describe the arrangement of the circuit area, the measurement mark area and the photolithography screening mark area in the photomask, and the means for determining the position error of the resist pattern obtained by exposing through the photomask. According to the present invention, however, configuration of the first to third embodiments can be also applied to the resist pattern, a pattern of an interlayer insulation layer pattern and a conductive layer pattern, which are provided on the semiconductor substrate, while position error generated between the patterns and moreover the patterning error can be also determined. For example, by carrying out the photolithography process on an exposure apparatus shown in FIG. 5, equipped with the photomask 100 shown in FIG. 1, a resist pattern is formed in a pattern layout shown in FIG. 6 on the resist layer (not shown, but on the conductive layer 250) provided on the semiconductor substrate 201. The semiconductor device 200 in FIG. 5 shows a sectional view along line C–D in FIG. 6.

The resulting resist pattern corresponds to the patterns on the photomask 100 in FIG. 1, and is substantially identical with the similar shape enlarged or reduced by the magnification of projection system in the photolithography process.

The semiconductor device 200 of the present invention is then manufactured by etching the conductive layer 250 and inter-layer insulation layer 240 provided below the resist patterns through the resist patterns 211 and 221. The first to third embodiments illustrate the case when the circuit pattern exemplifying the pattern of the gate electrode pattern for a transistor. In a fourth embodiment, it will be described that the present invention can be applied similarly to the other patterns (for example, contact holes and grooves).

Figure 7A:
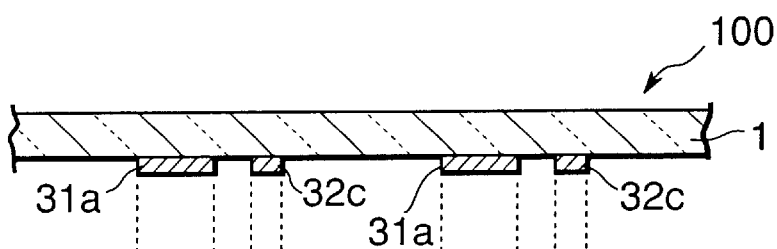
FIG. 7 is a process diagram showing the process of making the contact holes according to the fourth embodiment of the present invention.
Figure 7B:
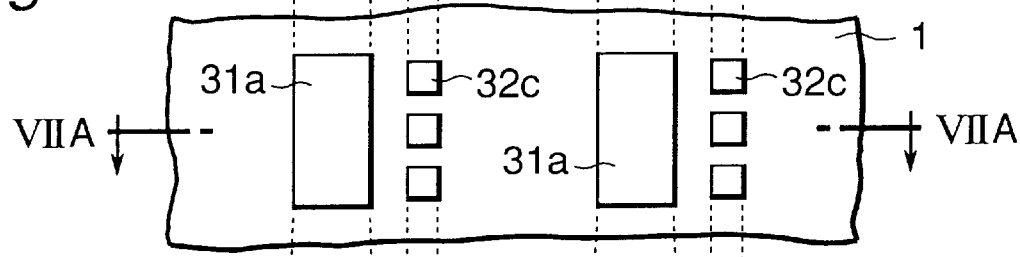
Figure 7C:
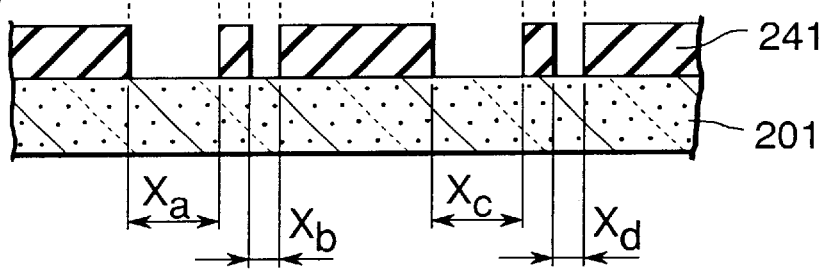

FIG. 7 shows an example of a process for producing a semiconductor device using the photomask of the present invention. FIGS. 7A and 7B are enlarged views of a part of the photomask 100, including the on-mask screening pattern 31a and an on-mask comparison pattern 32c formed in the on-mask photolithography screening mark area that is formed on the photomask substrate 1. The on-mask comparison pattern 32c has the same shape and dimensions-as the contact holes that are formed as one of the circuit pattern. FIG. 7A is a sectional view along a line VIIA—VIIA in FIG. 7B. FIG. 7C is a sectional view of the semiconductor device formed by exposing through the photomask, showing an inter-layer insulation layer pattern 241 formed on the semiconductor substrate 201.

In FIG. 7C, the inter-layer insulation layer pattern 241 includes patterns having dimensions of $X_a$ and $X_b$, respectively, that correspond to the patterns (that is the on-mask comparison pattern 31a and the on-mask screening pattern 32c) included in the on-mask photolithography screening mark area disposed in the right portion of the photomask 100, and patterns having dimensions of $X_c$ and $X_d$ that correspond to the patterns in the on-mask photolithography screening (the area including the on-mask comparison pattern 31a and the on-mask screening pattern 32c provided, at the left) disposed in the left portion of the photomask 100. The following equation holds between the dimensions $X_a$, $X_b$, $X_c$ and $X_d$.

$$|x_a-x_c|=|x_b-x_d| \qquad \text{(Equation 1)}$$

This means that, since the value of position error does not depend on the arrangement where the patterns for measuring the position error is formed in the semiconductor substrate of the present invention, dimensional differences between patterns of the same shape and the same dimensions formed in any position on the surface of the semiconductor substrate are consistent.

FIG. 8 shows a-process flow for forming as the circuit pattern.

Figure 8A:
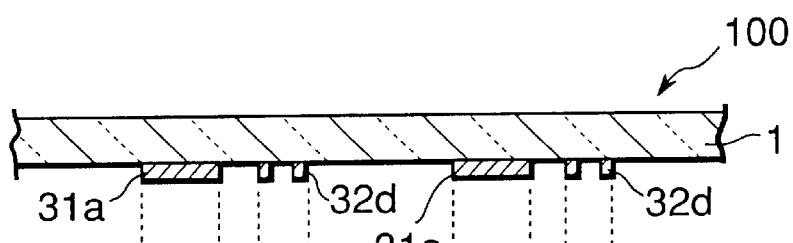
FIG. 8 is a process diagram showing the process of making the grooves according to the fourth embodiment of the present invention.
Figure 8B:
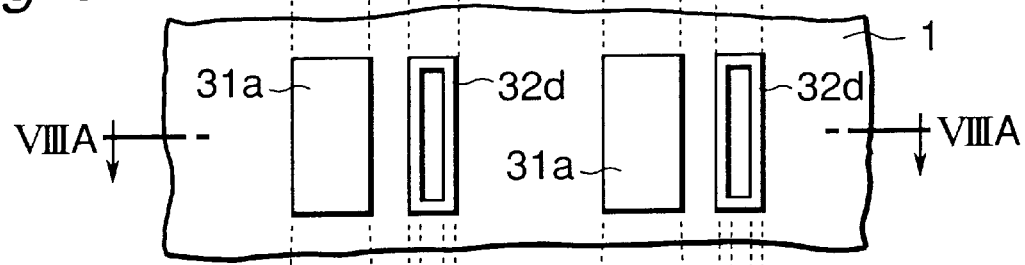
Figure 8C:
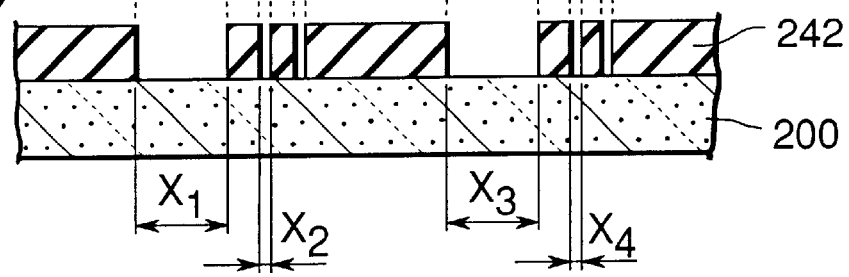

FIGS. 8A, 8B show enlarged views of a part of the photomask 100 including the on-mask screening pattern 31a and the on-mask comparison pattern 32d of groove type formed in the on-mask photolithography screening mark area on the photomask substrate 1. FIG. 8A is a sectional view along a line VIIIA—VIIIA in FIG. 8B. FIG. 8C is a sectional view of the semiconductor device 200 obtained by exposing through the photomask 100, inclusing an interlayer insulation layer pattern 242 formed on the semiconductor substrate 201. In FIG. 8C, dimentions $X_1$, $X_2$, $X_3$ and $X_4$ of the patterns 242's also have a relation with the same equation as one mentioned hereinabove similarly to the above.

$$|X_1-X_3|=|X_2-X_4| \qquad \text{(Equation 2)}$$

According to the present invention, as shown in FIGS. 7 and 8, position errors of the patterns can also be determined in a single manufacturing process when the circuit pattern (that is, the on-mask or on-resist comparison pattern) is contact holes or grooves. Further according to the present invention, the position error does not depend on the arrangement of the screening pattern and the comparison pattern on the mask or on the resist in the surface, and a pattern having less position error is formed.

Embodiment 5 (Exposure method)

Figure 9:
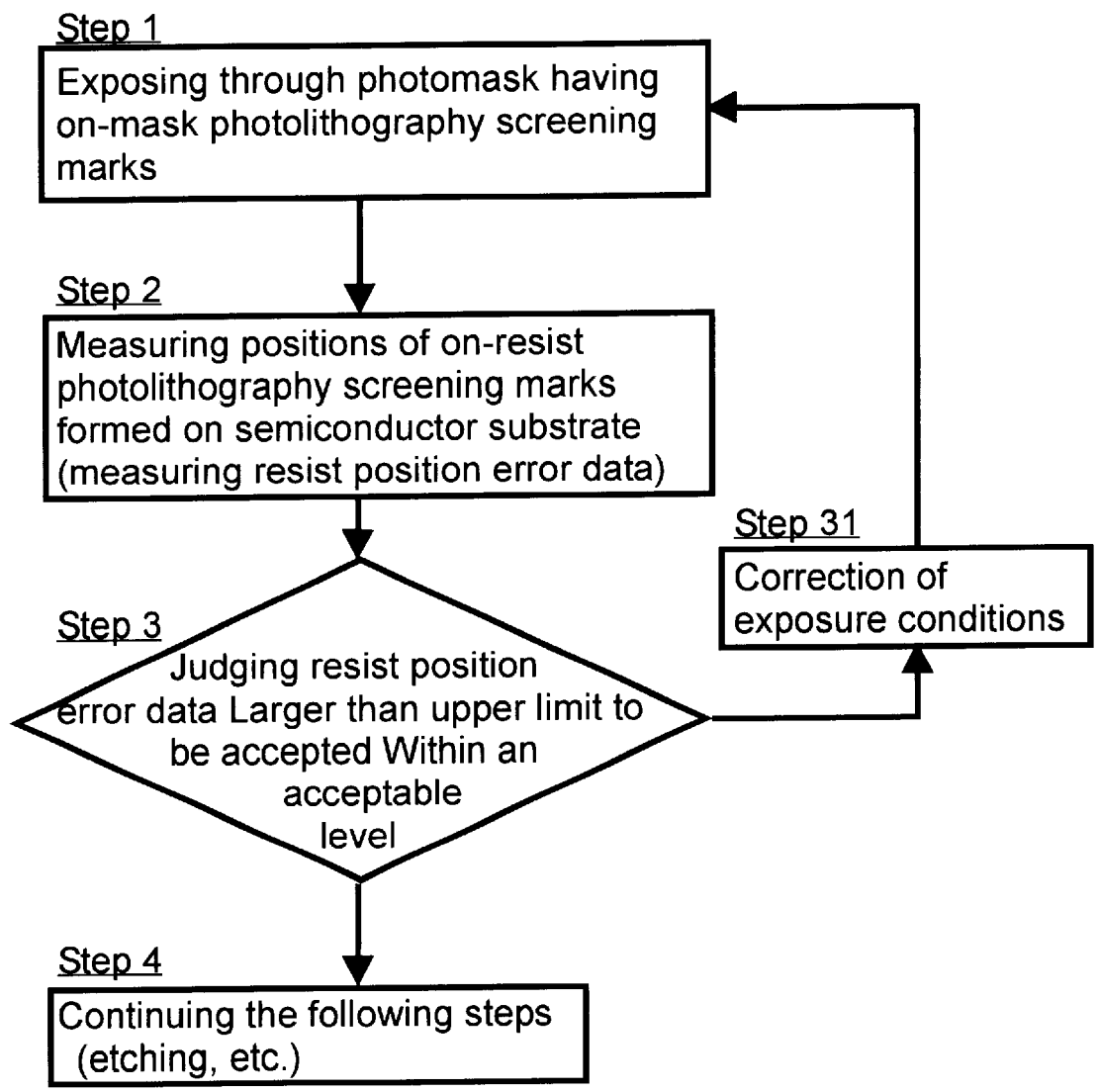
FIG. 9 is a process flow chart showing the exposure method (fifth embodiment) of the present invention.

The sixth embodiment illustrates a method for exposing though the photomask 100 of the present invention. FIG. 5 is a schematic sectional view of the exposure method of the present invention, and FIG. 9 is a process flow chart of the exposure method of the present invention. In FIG. 5, sectional view along line A–B of the photomask 100 corresponds to the section along line A–B of FIG. 1.

FIG. 5 shows a step that by using an exposure apparatus that includes the photomask 100 of the present invention in optical system 70, the resist patterns 211 and 221 are formed on the semiconductor substrate 201. In this embodiment, a stepper type exposure apparatus is used as the exposure apparatus, but the present invention is not limited thereto.

In the photomask 100 shown in FIG. 5, the on-mask circuit patterns 11a and 11b and the on-mask test pattern 21 are formed on the photomask substrate 1. A light beam 50 emitted from a light source 40 equipped in the optical system 70 is passed through a lens 60, and the photomask 100 to reach a resist layer (not shown) deposited on the semiconductor substrate 201. The resist layer is deposited on a gate insulation layer 240 and a conductive layer 250 made of polysilicon or the like which are preliminarily formed on the surface of the semiconductor substrate 201. The semiconductor substrate 201 is then subjected to development and the other treatment, and thereby the resist patterns 211 and 221 are formed.

The exposure method of the present invention will now be described below with reference to FIG. 9.

First the exposure operation described above and then development and other operations are carried out (step 1 in FIG. 9), thereby to obtain the resist patterns 211, 221. Position error is then determined by measuring the distance between the on-resist comparison pattern and the on-resist screening pattern, among the resulting resist patterns (step 2 in FIG. 9).

Then judgment is made on the value of the position error (step 3 in FIG. 9). When the value of the position error is larger than an upper limit to be accepted in the art, the exposure conditions for the exposure apparatus may be changed based on the value. (step 31 in FIG. 9). Then after exposing and developping the resist layer again, position error is checked again.

The above procedure is repeated till the value of the resist position error falls within the limit. When the value of the position error for the resist patterns is within an accepted level, the subsequent steps such as etching using the resist pattern is carried out (step 4 in FIG. 9).

According to the exposure method of the fifth embodiment, since determining the actual position error that is the second problem in the prior art can be achieved in one manufacturing process, analysis is made easier.

In the fifth embodiment, moreover, an exposing step is performed with the optical system 70 in the exposure apparatus shown in FIG. 5, which is equipped with the photomask 100 having a plurality of on-mask photolithography screening mark areas 30a to 30d disposed on the photomask substrate 1 as shown in FIG. 1. As a consequence, an amount and the tendency of the position error can be determined accurately over the entire region on the semiconductor substrate 201 to be exposed in a single procedure, and therefore the accuracy of analyzing the position error can be improved.

The present invention has the following effects.

According to the present invention, since an on-mask comparison pattern and an on-mask screening pattern are disposed close to each other in an on-mask photolithography screening mark area on the photomask substrate, a value of a resist position error can be analyzed easily in each manufacturing process.

The photomask of the present invention makes it possible to determine the value of position error with higher accuracy by optimizing the arrangement of the patterns in the on-mask photolithography screening mark area.

The photomask of the present invention makes it possible to decrease an area necessary for forming a measurement mark area on the photomask, by serving the on-mask test pattern serve as the on-mask screening pattern.

According to the present invention, the photomask has a plurality of on-mask-photolithography screening mark areas formed at any desired positions, and therefore it is made possible to eliminate or significantly decrease the change in the position data due to the arrangement of the on-mask photolithography screening mark areas on the photomask. That is, use of the photomask of the present invention improves the accuracy of analyzing the position error.

In the semiconductor device of the present invention, since the screening pattern and the comparison pattern are disposed close to each other in the photolithography screening mark area on the semiconductor substrate, value of position error can be analyzed easily in a single manufacturing process. Moreover, in the semiconductor device of the present invention, since the resist pattern formed on the semiconductor substrate by exposing through the photomask does not change a position depending on the arrangement of the resist patterns in the surface, there occurs no or very small difference of the position error between different arrangements.

In the semiconductor device of the present invention, since arrangement of the patterns in the photolithography screening mark area is optimized, value of position error can be determined more accurately.

In the semiconductor device of the present invention, an area of the measurement mark to be formed on the semiconductor substrate can be decreased by serving the measurement pattern serve as the screening pattern.

In the semiconductor device of the present invention, providing a plurality of photolithography screening mark areas makes it possible to determine the data of position error over the entire surface of the semiconductor substrate, thus improving the accuracy of analysis.

In the exposure method of the present invention, since an exposure conditions may be corrected based on the value of position error obtained by measuring a distance between the on-resist comparison pattern and the on-resist screening pattern, the position error and even the patterning error can be easily eliminated in one manufacturing process.

What is claimed is:

1. A semiconductor device comprising a semiconductor substrate with a circuit area including circuit patterns and a measurement mark area including measurement patterns formed in the same manufacturing process as the circuit pattern, both areas formed on the surface of the semiconductor substrate, wherein the semiconductor substrate further includes a photolithography screening mark area including a screening pattern and a comparison pattern, said comparison pattern has substantially the same configuration as at least a part of the circuit pattern, and the screening pattern has substantially the same configuration as at least a part of the measurement plan.

2. The semiconductor device according to claim 1, wherein the screening pattern and the comparison pattern are disposed close to each other in the same manufacturing process.

3. The semiconductor device according to claim 1, comprising a plurality of photolithography screening mark areas including a screening pattern formed on the surface of the semiconductor substrate, wherein the photolithography screening mark area further includes the comparison pattern formed in the same manufacturing process as the screening pattern to be close thereto, and a dimensional difference between the screening patterns having the same configuration and the same dimensions included in different photolithography screening mark areas equals to a dimensional difference between the comparison patterns of the same configuration and the same dimensions included in the photolithography screening mark areas.

4. The semiconductor device according to claim 1, manufactured by employing a photolithography process using a photomask comprising a photomask substrate, and an on-mask circuit areas including on-mask circuit patterns, an on-mask test mark area including on-mask test patterns, and an on-mask photolithography screening mark area including an on-mask comparison pattern and an on-mask screening pattern, all of them formed on the surface of the substrate, wherein the on-mask comparison pattern has substantially the same configuration as at least a part of the on-mask circuit pattern, and the on-mask screening pattern has substantially the same configuration as at least a part of the on-mask test pattern to form a plurality of photolithography screening mark areas corresponding to the on-mask photolithography screening mark areas which includes a screening pattern corresponding to the on-mask screening pattern and a comparison pattern corresponding to the on-mask comparison pattern on the surface of the semiconductor substrate, a dimensional difference between the screening patterns having the same configuration and the same dimensions included in different photolithography screening mark areas equals to a dimensional difference between the comparison patterns having the same configuration and the same dimensions included in the photolithography screening mark areas.

5. The semiconductor device according to claim 1, manufactured by employing a photolithography process using a photomask comprising:

a photomask substrate; and an on-mask circuit area including on-mask circuit patterns, an on-mask test mark area including on-mask testing patterns, and an on-mask photolithography screening mark area including an on-mask comparison pattern and an on-mask screening pattern, all of them formed on the surface of the substrate, wherein the on-mask screening pattern and the on-mask comparison pattern are disposed close to each other on the photomask;

wherein the on-mask comparison pattern has substantially the same configuration as at least a part of the on-mask circuit pattern, and the on-mask screening pattern has substantially the same configuration as at least a part of the on-mask test pattern to form a plurality of photolithography screening mark areas corresponding to the on-mask photolithography screening mark areas which includes a screening pattern corresponding to the on-mask screening pattern and a comparison pattern corresponding to the on-mask comparison pattern on the surface of the semiconductor substrate, a dimensional difference between the screening patterns having the same configuration and the same dimensions included in different photolithography screening mark areas equals to a dimensional difference between the comparison patterns having the same configuration and the same dimensions included in the photolithography screenings mark areas.

6. The semiconductor device according to claim 1, wherein either one of the screening pattern or the comparison pattern is disposed at both ends of the other.

7. The semiconductor device according to claim 1, wherein either one of the screening pattern or the comparison pattern is disposed to surround the other.

8. The semiconductor device according to claim 1, wherein the screening pattern and the comparison pattern combine to form a cross-shaped mark.

9. The semiconductor device according to claim 1, wherein either one of the photolithography screening mark area and the measurement mark area is included in the other, and the measurement pattern further serves as the screening-pattern.

10. The semiconductor device according to claim 1, comprising a plurality of the photolithography screening mark areas.

11. A method for exposing on an exposure apparatus equipped with a photomask, comprising:

(i) a step of exposing a resist layer formed on a surface of a semiconductor substrate to light on the exposure apparatus equipped with the photomask comprising a photomask substrate, and an on-mask circuit area including on-mask circuit patterns, an on-mask test mark area including on-mask test patterns and an on-mask photolithography screening mark area including an on-mask comparison pattern and an on-mask screening pattern, all of them formed on the surface of the substrate, wherein the on-mask comparison pattern has substantially the same configuration as at least a part of the on-mask circuit pattern, and the on-mask screening pattern has substantially the same configuration as at least a part of the on-mask test pattern, thereby to form:

an on-resist circuit area that correspond to the on-mask circuit area, on-resist circuit patterns that correspond to the on-mask circuit patterns, an on-resist test mark area that correspond to the on-mask test mark area, on-resist test patterns that correspond to the on-mask test patterns, an on-resist photolithography screening mark area that correspond to the on-mask photolithography screening mark area, an on-resist screening pattern that correspond to the on-mask screening pattern, and an on-resist comparison pattern that correspond to the on-mask comparison pattern on the resist layer; and (ii) a step of correcting the exposure conditions based on a position error data obtained by measuring a distance between the on-resist screening pattern and the on-resist comparison pattern.

12. The exposure method according to claim 11, wherein the on-mask comparison pattern and the on-mask screening pattern are disposed close to each other on the photomask.

13. The exposure method according to claim 11, wherein either one of the on-mask photolithography screening mark area or the on-mask test mark area is included in the other, and the on-mask test pattern further serves as the on-mask screening pattern.

* * * * *